United States Patent [19]

Lee

[11] Patent Number: 5,256,984
[45] Date of Patent: Oct. 26, 1993

[54] AMPLIFIER FOR CONTROLLING LINEAR GAIN OF WIDE BAND USING EXTERNAL BIAS

[75] Inventor: Ga H. Lee, Bucheon, Rep. of Korea

[73] Assignee: SamSung Electronics Co., Ltd., Suwon, Rep. of Korea

[21] Appl. No.: 859,979

[22] Filed: Mar. 30, 1992

[30] Foreign Application Priority Data

Apr. 17, 1991 [KR] Rep. of Korea ............... 91-6146

[51] Int. Cl.$^5$ ............... H03F 3/45; H03G 3/00
[52] U.S. Cl. ............... 330/254; 330/261; 330/311
[58] Field of Search ............... 330/129, 254, 279, 285, 330/252, 261, 311

[56] References Cited

PUBLICATIONS

Liu, "Differential Variable-Gain Amplifier", *IBM Technical Disclosure Bulletin*, vol. 15, No. 5, Oct. 1972, pp. 1444–1445.

Holt, Charles, *Electronic Circuits: Digital and Analog*, John Wiley & Sons, 1978, pp. 608–615.

Horowitz and Hill, *The Art of Electronics*, Cambridge University Press, 1981, pp. 554–563.

*Primary Examiner*—James B. Mullins
*Attorney, Agent, or Firm*—Robert E. Bushnell

[57] ABSTRACT

An amplifier for controlling the linear gain of wide band using an external bias voltage is disclosed to maintain the gain characteristics stably even for the high frequency input signals by adjusting the external bias voltage to prevent the amplified gain from being distorted or the gain from being decreased when increasing the linearity, where in a first fine voltage is generated with the inverse hyperbolic tangent function of the external bias voltage for adjusting the gain, a first voltage is generated with the hyperbolic tangent function of the first fine voltage and linearly proportional to the external bias voltage, a second fine voltage is generated with the inverse hyperbolic tangent function of the input signal voltage, a second voltage is generated with the hyperbolic tangent function of the second fine voltage for adjusting the first voltage, and the second voltage is converted to the linearly corresponding output signal voltage, thereby amplifying the gain even for the high frequency input signals, without any distortion.

20 Claims, 2 Drawing Sheets

AMPLIFIER FOR CONTROLLING LINEAR GAIN OF WIDE BAND USING EXTERNAL BIAS

BACKGROUND OF THE INVENTION

The present invention relates to an amplifier and, more particularly, to an amplifier for controlling linear gain of wide band using external bias which controls the amplification gain at high frequencies of a wide band input signal and has good linear gain characteristics for high-frequency and large-input signal by adjusting an external bias.

In image processing systems such as video tape recorders and televisions, differential amplifiers as shown in FIG. 1A and 1B are normally employed to amplify high-frequency image signals. In these amplifiers two identical transistors Q1 and Q2 are symmetrically composed between positive and negative supply voltages $V_{cc}$ and $-V_{EE}$ and common emitter current IEE is a constant current source. Collector resistors $R_c$'S of the transistors Q1 and Q2 are identical with each other, and emitter resistors $R_e$ are also identical with each other. Then, an input signal Vin applied to the base of the transistor Q1 is amplified and provided through the collector resistors Rc as an output voltage $V_c$.

On the other hand, the gain of the amplifier shown in FIG. 1A is determined as follows. Applying the Kirchhoff's voltage law to a loop including the base-emitter junctions of the transistors Q1 and Q2, the following equation is satisfied, $$V_{in} = V_{BE1} - V_{BE2} \tag{1}$$

where, $V_{BE2}$, and $V_{BE2}$ are the base-emitter voltage drops of the transistors Q1 and Q2, respectively.

Eq.(1) can also be rewritten as follows, using the relationship $I_c = I_s$ $$\exp\left(\frac{V_{BE}}{V_T}\right), \tag{2}$$

$$V_{in} = V_T \ln(I_{c1}/I_{s1}) - V_T \ln(I_{c2}/I_{s2})$$

where, $V_T (=kT/q)$ is the thermal voltage and has a value of about 26 mV at 300° K, $I_s$ is the reverse saturation current and has a value of about $2 \times 10$ nA/cm² at 300° K, and $I_{c1}$ and $I_{c2}$ are the collector currents of the transistors Q1 and Q2.

Assuming that the transistors Q1 and Q2 are identical with each other, i.e., $I_{s1} = I_{s2}$, then Eqs.(1) or (2) can be rewritten as, $$\frac{I_{c1}}{I_{c2}} = \exp\left(\frac{V_{BE1} - V_{BE2}}{V_T}\right) = \exp\left(\frac{V_{in}}{V_T}\right). \tag{3}$$

Also, the following relation is satisfied, $$I_{c1} = I_{c2} = \alpha F \cdot I_{EE} \tag{4}$$

where, $\alpha F$ is the current amplification ratio in common-base configuration and has a value of almost 1.

Thus, the collector currents $I_{c1}$ and $I_{c2}$ are given from Eqs. (3) and (4), by $$I_{c1} = \frac{\alpha F \, I_{EE}}{1 + \exp\left(-\frac{V_{in}}{V_T}\right)} \tag{5}$$

$$I_{c2} = \frac{\alpha F \, I_{EE}}{1 + \exp\left(\frac{V_{in}}{V_T}\right)} \tag{6}$$

On the other hand, the output voltage $V_{o1}$ from the transistor Q1 and the output voltage $V_{o2}$ from the transistor Q2 are given by, respectively, $$V_{o1} = V_{cc} - I_{c1} \cdot R_c \tag{7}$$

$$V_{o2} = V_{cc} - I_{c2} \cdot R_c \tag{8}$$

Then, the final differential output voltage $V_o$ becomes, $$V_o = V_{o1} - V_{o2} \tag{9}$$

$$= \alpha F \, I_{EE} \tanh\left(-\frac{V_{in}}{2V_T}\right). \tag{10}$$

As expressed in Eq.(10), when the input voltage $V_{in}$ is larger than $V_T$, a large distortion is produced due to hyperbolic tangent characteristics and thereby the circuit shown in FIG. 1A is no longer used as an amplifier.

In order to compensate the distortion, resistors $R_e$ are appended to both emitters of the transistors Q1 and Q2. Then, the linearity is improved, but in has still another problem that the voltage gain is reduced.

SUMMARY OF THE INVENTION

The present invention solves these problems and provides an amplifier for controlling linear gain of wide band which amplifies a high-frequency and large-input wide band signal without distortion, by using external bias.

Further, the present invention provides an amplifier for controlling linear gain of wide band which is able to control the amplification gain of the high-frequency input signal by external bias adjustment.

Further more, the present invention provides an amplifier for controlling linear gain of wide band which is able to maintain stable gain characteristics even at high-frequency range by external bias adjustment.

According to the present invention, there is provided an amplifier for controlling linear gain of wide band including an amplifier for high-frequency application, comprising a first voltage generator for generating a first fine voltage with the inverse hyperbolic tangent function of an external bias voltage, a first voltage-to-current converter for generating a first current which is the hyperbolic tangent function of the first fine voltage, thereby being proportional linearly to the external bias, a second voltage generator for generating a second fine voltage with the inverse hyperbolic tangent function of an input signal, a second voltage-to-current converter for controlling the first current by generating a second current which is the hyperbolic tangent function of the second fine voltage, thereby being proportional linearly to the input signal, and a current-to-voltage converter for converting the first current to a linear output voltage.

DETAILED DESCRIPTION OF THE PREFERRED EMBODIMENT

Figure 1A:
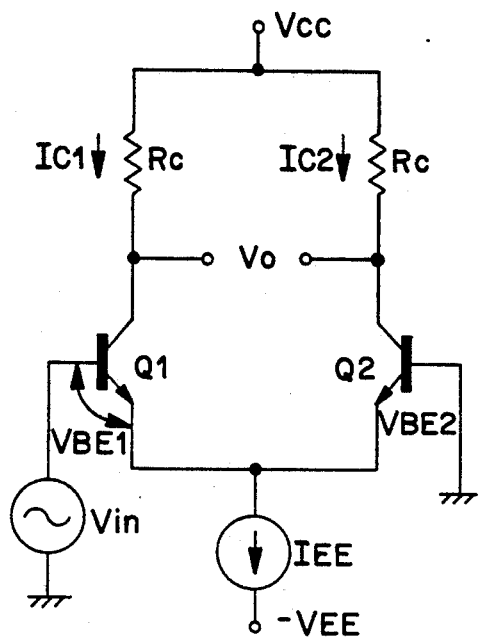
FIGS. 1A and 1B show conventional amplifier circuits.
Figure 1B:
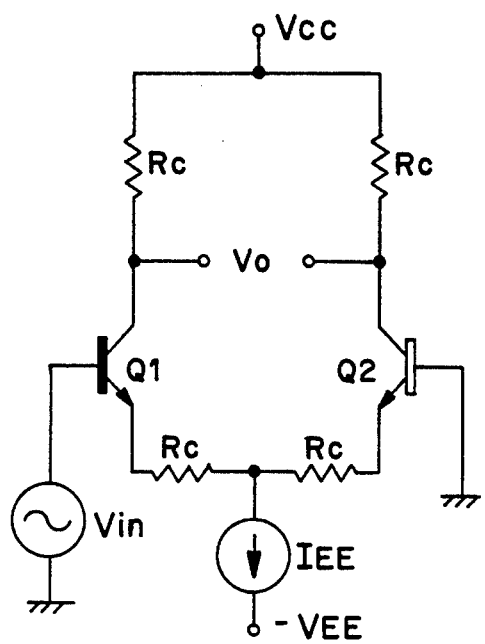
Figure 2:
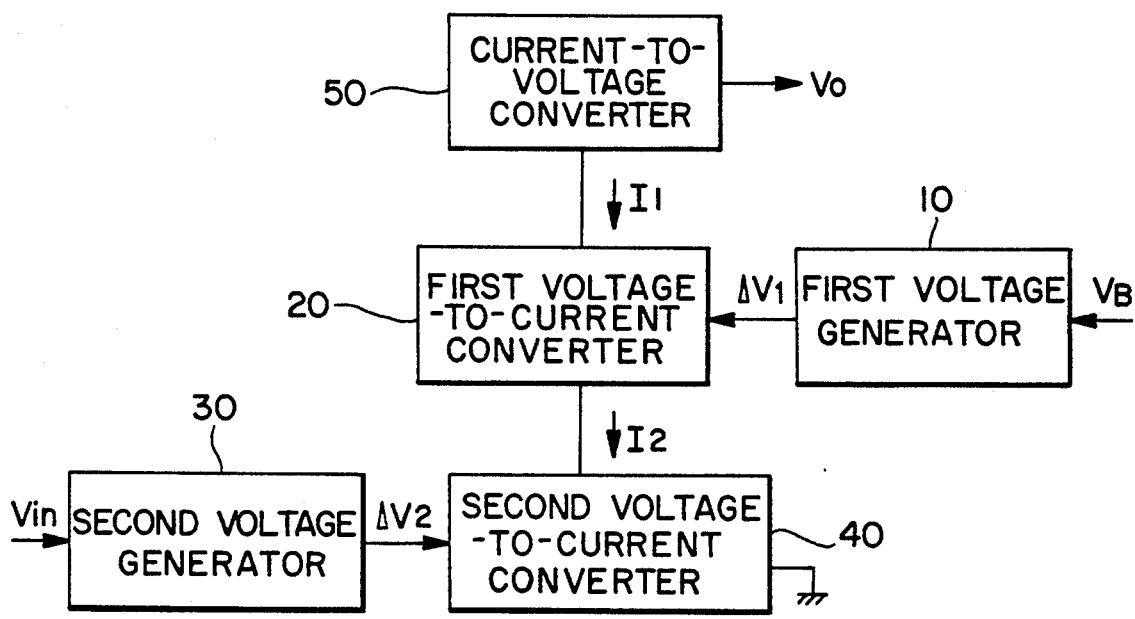
FIG. 2 is a block diagram of an amplifier according to the present invention.

The present invention will be now described in more detail with reference to accompanying drawings. FIG. 2 shows the block diagram of an amplifier according to the present invention, which comprises a first voltage generator 10 for producing a first fine voltage $\Delta V_1$ with the inverse hyperbolic tangent ($\tanh^{-1}$) function of an external bias voltage $V_B$ for gain compensation, a first voltage-to-current (V/I) converter 20 connected to the first voltage generator 10 for generating a first current I1 with the hyperbolic tangent function (tanh) of the first fine voltage, thereby being proportional linearly to the external bias voltage $V_B$, a second voltage generator 30 for producing a second fine voltage $\Delta V_2$ with the inverse hyperbolic tangent function of an input voltage $V_{in}$, a second voltage-to-current converter 40 connected to the second voltage generator 30 for generating a second current I2 with the hyperbolic tangent function of the second fine voltage $\Delta V_2$, thereby being proportional linearly to the input voltage $V_{in}$, and a current-to-voltage (I/V) converter 50 connected to the first voltage-to-current converter 20 for converting the first current $I_1$ to a linear output voltage $V_o$.

The first voltage generator 10 receives the external bias voltage $V_B$ for controlling amplification gain and generates the first fine voltage $\Delta V_1$ with the inverse hyperbolic tangent function of $V_B$. Since the external bias voltage $V_B$ is a DC voltage having a predetermined variable range, the first fine voltage $\Delta V_1$ does not exceed 1V.

The first voltage-to-current converter 20 converts the first fine voltage $\Delta V_1$ to the first current $I_1$ with the hyperbolic tangent function of $\Delta V_1$. Thus, the first current $I_1$ is proportional linearly to the external bias voltage $V_B$.

On the other hand, the second voltage generator 30 receives the high-frequency input signal $V_{in}$ and generates the second fine voltage $\Delta V_2$ with the inverse hyperbolic tangent function of $V_{in}$. The second fine voltage $\Delta V_2$ is proportional to the input voltage $V_{in}$, but does not exceed 1V, similar to the first fine voltage $\Delta V1$.

The second voltage-to-current converter 40 converts the second fine voltage $\Delta V_2$ to the second current $I_2$ with the hyperbolic tangent function of $\Delta V_2$. Thus, the second current is proportional linearly to the input voltage $V_{in}$. Also, if the second current I2 is varied, the external bias voltage $V_B$ is varied and thereby the first current $I_1$ is also varied. Thus, the first and second currents $I_1$ and $I_2$ are dependent linearly on each other.

As described above, the first current $I_1$ is adjusted by the external bias voltage $V_B$ and proportional linearly to the second current I2, and converted to the output voltage $V_o$ by the current-to-voltage converter 50. The output voltage $V_o$ is also proportional linearly to the first current $I_1$. Accordingly, a desired gain is achieved by adjusting the external bias voltage $V_B$; and the linearity of the amplifier is maintained stably regardless of the magnitude of the high-frequency input signal $V_{in}$.

Figure 3:
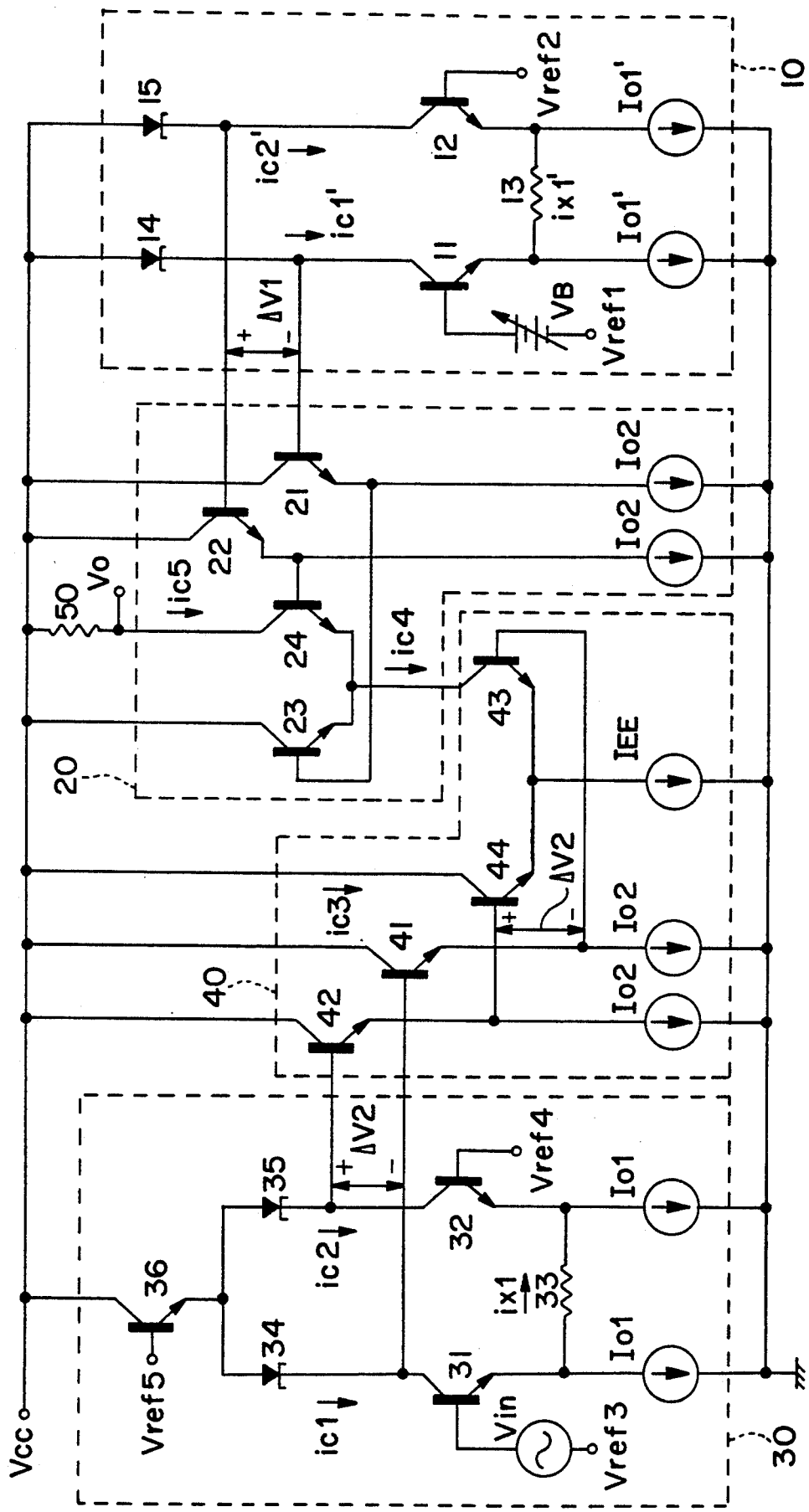
FIG. 3 is a detailed circuit of a preferred embodiment of the amplifier in FIG. 2 according to the present invention.

FIG. 3 is the detailed circuit showing the embodiment of FIG. 2 according to the present invention, which comprises first and second voltage generators 10 and 30, first and second voltage-to-current converters 20 and 40, and a current-to-voltage converter 50, identical to the configuration in FIG. 2.

The first voltage generator 10 comprises transistors 11 and 12 of which emitters are symmetrically connected to each constant current source $I_{o1}$ and bases are connected to an external bias voltages $V_B$ added to a first reference voltage $V_{ref1}$ and a second reference voltage $V_{ref2}$, respectively, resistor 13 connected between the emitters of the transistors 11 and 12, and diodes 14 and 15 of which cathodes are respectively connected to the collectors of the transistors 11 and 12 and anodes are connected in common to a supply voltage $V_{cc}$.

The first voltage-to-current converter 20 comprises transistors 21 and 22 connected between the supply voltage $V_{cc}$ and to each constant current source $I_{o2}$ for buffering the input signals applied to each base from the collectors of the transistors 11 and 12, and emitter-coupled transistors 23 and 24 for receiving the output voltages from the emitter nodes of the transistors 21 and 22 as differential input signals.

The second voltage generator 30 comprises transistors 31 and 32 of which emitters are symmetrically connected to each constant current source $I_{o1}$ and bases are respectively connected to an input voltages $V_{in}$ added to a third reference voltage $V_{ref3}$ and a fourth reference voltage $V_{ref4}$, a resistor 33 connected between the emitters of the transistors 31 and 32, and diodes 34 and 35 of which cathodes are respectively connected to the collectors of the transistors 31 and 32 and bases are connected to each other, and a transistor 36 of which a base is connected to a fifth reference voltage $V_{ref5}$ for providing a desired voltage to the common anode node of the diodes 34 and 35 by a constant voltage dropped from the supply voltage $V_{cc}$.

The second voltage-to-current converter 40 comprises transistors 41 and 42 connected between the supply voltage $V_{cc}$ and each constant current source $I_{o2}$ for buffering the input signals applied to each base from the collectors of the transistors 31 and 32, and transistors 43 and 44 of which bases are respectively connected to the emitters of the transistors 41 and 42 and emitters are connected in common to a constant current source $I_{BB}$. The collector of the transistor 43 is connected to the common-emitter node of the transistors 23 and 24, while that of the transistor 44 is connected to the supply voltage $V_{cc}$.

The current-to-voltage converter 50 comprises only a resistor connected between the supply voltage $V_{cc}$ and the collector of the transistor 24. All of the transistors in FIG. 3 are NPN type. Also, all of the diodes in FIG. 3 are formed by using NPN transistors, i.e., the base of the NPN transistor is used as the anode, and the collector and emitter are tied to be used as the cathode.

Now, the operation of the embodiment according to the present invention shown in FIG. 3, is described in more detail.

The input-to-output voltage gain $V_o/V_{in}$ is determined by the following sequence.

Neglecting the base currents of the transistors 31 and 32, first, their collector currents become, respectively, $$i_{c1} = I_{o1} + i_{x1} \quad (11)$$

$$i_{c2} = I_{o1} - i_{x1} \quad (12)$$

where, $i_{c1}$, $i_{c2}$, $I_{o1}$, and $i_{x1}$ are the collector current of the transistor 31, the collector current of the transistor 32, the constant current source, and the current flowing through the resistor 33 connected between the emitters of the transistors 31 and 32, respectively.

Applying the Kirchhoff's second law (voltage law) to a loop including the base-emitter junctions of the transistors 31 and 32, the input voltage $V_{in}$ is expressed as, $$V_{in} = V_{BB1} - V_{BB2} + i_{x1} \cdot R_x \quad (13)$$

where, $V_{BB1}$ and $V_{BB2}$ are the base-emitter voltages of the transistors 31 and 32, respectively, and $R_x$ is the value of the resistor 33 connected between the emitters of the transistors 31 and 32.

Eq.(14) can be rewritten as, $$V_{in} = V_T \ln \frac{i_{c1}}{I_{s1}} - V_T \ln \frac{i_{c2}}{I_{s2}} + i_{x1} R_x \quad (14)$$

where, $V_T$ is the thermal voltage and $I_{s1}$ and $I_{s2}$ are the reverse saturation currents of the transistors 31 and 32, respectively, as explained in Eq. (2).

If the transistors 31 and 32 are identical with each other, i.e., the base doping density and the geometrical size are the same, then $I_{s1}$ is equal to $I_{s2}$ and thus Eq. (14) can be reduced to, $$V_{in} = V_T \ln \frac{i_{c1}}{i_{c2}} + i_{x1} \cdot R_x \quad (15)$$

Dividing both sides of Eq. (15) by $R_x$ and substituting Eq.(11) and (12), one obtains, $$\frac{V_{in}}{R_x} = \frac{V_T \ln \left| \frac{I_{c1} + i_{x1}}{I_{c1} - i_{x1}} \right|}{R_x} + i_{x1}. \quad (16)$$

If the first term on the right side of Eq. (16) becomes zero, $V_{in}$ is dependent linearly on $i_{x1}$.

Differentiating the first term of Eq. (16) with respect to $i_{x1}$, in order to identify this substantially, the following equation is satisfied, $$\frac{\partial \left( V_T \ln \left| \frac{I_{c1} + i_{x1}}{I_{c1} - i_{x1}} \right| \right)}{\partial i_{x1}} = \quad (17)$$

$$\frac{\frac{V_T}{I_{c1} + i_{x1}} + \frac{V_T}{I_{c1} - i_{x1}}}{R_x} = \frac{r_{e1} + r_{e2}}{R_x}$$

where, $r_e$ is the small-signal dynamic resistance at the emitter node of the transistor.

If $R_x > r_{e1} + r_{e2}$, then, Eq. (16) satisfies the linear relationship, i.e., $V_{in}$ is dependent linearly on $i_{x1}$. Thus, Eq. (11) and (12) can be simplified to, $$i_{c1} = I_{c1} + \frac{V_{in}}{R_x} \quad (18)$$

-continued $$i_{c2} = I_{c1} - \frac{V_{in}}{R_x}. \quad (19)$$

Since $i_{c1}$ and $i_{c2}$ are different from each other as shown in Eqs. (18) and (19), voltage drops across the diodes 34 and 35 are also different from each other. This difference between the diode voltage drops is applied between the bases of the transistors 43 and 44. Applying the Kirchhoff's second law, the following equation is satisfied, $$\Delta V_2 = V_{BE3} - V_{BE4} \quad (20)$$

where, $V_{BE1}$ and $V_{BE2}$ are the voltage drops across the diodes 34 and 35, respectively, and $V_2$ is the second fine voltage. Therefore, Eq. (20) can be rewritten as, $$\Delta V_2 = V_T \ln \frac{i_{c1}}{I_{s3}} - V_T \ln \frac{i_{c2}}{I_{s4}} = V_T \ln \left| \frac{i_{c1}}{i_{c2}} \cdot \frac{I_{s4}}{I_{s3}} \right| \quad (21)$$

where, $I_{s3}$ and $I_{s4}$ are the reverse saturation current of the diodes 34 and 35, respectively, as described in Eq. (2).

Assuming that the diodes 34 and 35 are identical with each other, i.e., $I_{s3} = I_{s4}$, Eq. (21) is reduced to, $$\Delta V_2 = V_T \ln \frac{i_{c1}}{i_{c2}} = V_T \ln \left| \frac{I_{c1} + \frac{V_{in}}{R_x}}{I_{c1} - \frac{V_{in}}{R_x}} \right| \quad (22)$$

Using the relationship $$\tanh^{-1} x = \tfrac{1}{2} \ln \frac{1 + x}{1 - x}, \quad (23)$$

Eq. (22) can be written as, $$\Delta V_2 = 2 V_T \tanh^{-1} \frac{V_{in}}{R_x I_{c1}} \quad (24)$$

Thus, the voltage drop difference between the diodes 34 and 35 is the inverse hyperbolic tangent function of the input voltage. The voltage drop difference, i.e., the second fine voltage $\Delta V_2$ is buffered by the transistors 41 and 42 and next applied between the transistors 43 and 44, thereby determining their collector currents $i_{c4}$ and $i_{c3}$.

Thus, the second fine voltage $\Delta V_2$ can be rewritten as, $$\Delta V_2 = V_{BE5} - V_{BE6} \quad (25)$$
$$= V_T \ln \frac{i_{c3}}{I_{s5}} - V_T \ln \frac{i_{c4}}{I_{s5}}$$

where, $V_{BE5}$ and $V_{BE6}$ are the base-emitter voltage of the transistors 44 and 43.

Assuming that the transistors 43 and 44 are identical with each other. Eq. (25) becomes, $$\Delta V_2 = V_T \ln \frac{i_{c3}}{i_{c4}}. \quad (26)$$

-continued then, $$\frac{i_{c3}}{i_{c4}} = \exp\left(\frac{\Delta V_2}{V_T}\right). \tag{27}$$

also, the following relation is satisfied, $$i_{c3} + i_{c4} = \alpha F \cdot I_{EE} \tag{28}$$

where, $I_{EE}$ is the constant current and $\alpha F$ is almost 1. Thus, Eq. (28) is reduced to, $$i_{c3} + i_{c4} = I_{EE} \tag{29}$$

From Eq. (27) and (29), the collector currents of the transistors 44 and 43 are given by, respectively, $$i_{c3} = \frac{I_{EE}}{1 + \exp\left(-\frac{\Delta V_2}{V_T}\right)} \tag{30}$$

and $$i_{c4} = \frac{I_{EE}}{1 + \exp\left(\frac{\Delta V_2}{V_T}\right)}. \tag{31}$$

Then, the collector current difference $\Delta I_c$ is given by, $$\Delta I_c = i_{c3} - i_{c4} = I_{EE} \tanh\left(\frac{\Delta V_2}{2V_T}\right) \tag{32}$$

That is, the collector current difference $I_c$ is the hyperbolic tangent function of the second fine voltage $\Delta V_2$.

Substituting Eq. (22) into Eq. (31) gives, $$i_{c4} = \frac{I_{EE}}{1 + \frac{I_{o1} R_x + V_{in}}{I_{o1} R_x - V_{in}}} = \frac{I_{EE}}{2} - \frac{I_{EE}}{2 I_{o1} \cdot R_x} V_{in} \tag{33}$$

Similarly, the collector current $i_{c5}$ of the transistor 24 becomes the function of the external bias voltage $V_B$, by $$i_{c5} = \frac{i_{c4}}{2} + \frac{i_{c4}}{2 I_{o1}' - R_{x}'} V_B \tag{34}$$

where, $I_{c1}'$ is the constant emitter current source and $R_x'$ is the value of the resistor 13 connected between the emitters of the transistors 11 and 12.

Combining Eqs. (33) and (34), the collector current $i_{c5}$ of the transistor 24 is given, as a function of $V_B$ and $V_{in}$, by $$i_{c5} = \frac{I_{EE}}{4}\left(1 - \frac{V_{in}}{I_{o1} R_x}\right)\left(1 + \frac{V_B}{I_{o1}' R_{x}'}\right) \tag{35}$$

Thus, the total gain $A_v$ of the amplifier in FIG. 3 is given by, $$A_v = \frac{V_o}{V_{in}} = -R_L i_{c5} \tag{36}$$

$$= \frac{I_{EE}}{4} \cdot \frac{R_L}{I_{o1} \cdot R_x}\left(1 + \frac{V_B}{I_{o1}' R_{x}'}\right)$$

where, $V_o$ is the output voltage from the amplifier and $R_L$ is the value of the output resistor 50.

The collector current $i_{c4}$ of the transistor 43, expressed in Eq. (33), corresponds to the second current I2 in FIG. 2 and the collector current $i_{c5}$ of the transistor 24 corresponds to the first current I1 in FIG. 2. Thus, the voltage gain of the amplifier composed as FIG. 3 is determined by the current and the resistance at the output terminal, as expressed in Eq. (36).

As described hereinabove, the amplifier for controlling linear gain of wide band according to the present invention can obtain the desired gain for the high-frequency and large-input signal without the distortion.

What is claimed is:

1. An amplifier for controlling linear gain of wide band using external bias in a high-frequency application, comprising:
    first voltage generator means coupled to receive an external bias voltage, for generating a first voltage with an inverse hyperbolic tangent function of said external bias voltage;
    first voltage-to-current converter means for generating a first current with a hyperbolic tangent function of said first voltage so that said first current is linearly proportional to said external bias voltage;
    second voltage generator means coupled to receive an input signal, for generating a second voltage with an inverse hyperbolic tangent function of said input signal;
    second voltage-to-current converter means for controlling said first current by generating a second current with a hyperbolic tangent function of said second voltage so that said second current is linearly proportional to said input signal; and
    current-to-voltage converter means for converting said first current to a linear output voltage.

2. The amplifier according to claim 1, wherein said first voltage generator means comprises two transistors of which emitters are symmetrically connected to a constant current source and bases are respectively connected to a first reference voltage and a second reference voltage, a resistor connected between said emitters of said transistors, and two diodes of which cathodes are respectively connected to collectors of said transistors and of which anodes are connected in common to a supply voltage.

3. The amplifier according to claim 2, wherein said first voltage-to-current converter means comprises two emitter-coupled transistors connected between said supply voltage and a second constant current source for receiving input signals applied to each base from collectors of said transistors in said first voltage generator as an differential input voltage.

4. The amplifier according to claim 3, wherein said first voltage-to-current converter means further comprises two transistors connected between said supply voltage and a third current source for buffering output voltages from said first voltage generator, and for providing the output voltages to said emitter-coupled transistors.

5. The amplifier according to claim 1, wherein said second voltage generator means comprise two transistors of which emitters are symmetrically connected to a constant current source and bases are respectively coupled to receive a voltage of the input signal added to a first reference voltage, and a second reference voltage, a resistor connected between said emitters of the two transistors, and two diodes of which cathodes are respectively connected to collectors of the two transistors and anodes are connected to each other.

6. The amplifier according to claim 5, wherein said second voltage generator means further comprises a third transistor of which a base is connected to a third reference voltage, for providing a desired voltage to a common anode node of the two diodes with a constant voltage dropped from a supply voltage.

7. The amplifier according to claim 1, wherein said second voltage-to-current converter means comprises two emitter-coupled transistors connected between a supply voltage and a first constant current source, for receiving said input signals from said second voltage generator means, one collector being connected to said supply voltage, and the other collector being connected to said first voltage-to-current converter means.

8. The amplifier according to claim 7, wherein said second voltage-to-current converter means further comprises two transistors connected between said supply voltage and a second constant current source, for buffering the output voltages from said second voltage generator means, and for providing the output voltages to the bases of said emitter-coupled transistors.

9. The amplifier according to claim 1, wherein said current-to-voltage converter means comprises a resistor connected between a supply voltage and said said first voltage-to-current converter.

10. A high frequency amplifier, comprising:
means for providing a supply voltage and an external bias voltage;
means for receiving a wide-band signal having high frequency characteristics;
first voltage generator means interposed between said supply voltage and ground, for generating a first voltage as an inverse hyperbolic tangent of said external bias voltage;
second voltage generator means interposed between said supply voltage and ground, for generating a second voltage as an inverse hyperbolic tangent of a voltage of said wide-band signal;
first converter means interposed between said supply voltage and ground, for converting by a hyperbolic tangent of said second voltage into a first current so that said first current is linearly proportional to the voltage of said wide-band signal;
second converter means interposed between said supply voltage and ground, for converting by a hyperbolic tangent of said first voltage into a second current so that said second current is linearly proportional to said external bias voltage in dependence upon said first current; and
third converter means for converting said second current into an output voltage having a linear gain characteristic.

11. The high frequency amplifier according to claim 10, wherein said first voltage generator means comprises:
means for providing first and second current sources, and first and second reference voltages;
first and second diodes;
a first transistor having a first electrode of a principal electrically conducting channel coupled to said supply voltage via said first diode, a second electrode of said principal electrically conducting channel connected to ground via said first current source, and a control electrode coupled to receive said external bias voltage and said first reference voltage;
a second transistor having a first electrode of a principal electrically conducting channel coupled to said supply voltage via said second diode, a second electrode of said principal electrically conducting channel connected to ground via said second current source, and a control electrode coupled to receive said second reference voltage; and
a resistor interposed between the second electrodes of said first and second transistors.

12. The high frequency amplifier according to claim 10, wherein said second voltage generator means comprises:
means for providing first and second current sources, and first, second and third reference voltages;
first and second diodes serially connected to provide a common anode node;
a first transistor having a first electrode of a principal electrically conducting channel coupled to said supply voltage, a second electrode of said principal electrically conducting channel connected to said common anode node of said first and second diodes, and a control electrode coupled to receive said first reference voltage;
a second transistor having a first electrode of a principal electrically conducting channel coupled to a cathode of said first diode, a second electrode of said principal electrically conducting channel connected to ground via said first current source, and a control electrode coupled to receive the voltage of said wide-band signal and said second reference voltage;
a third transistor having a first electrode of a principal electrically conducting channel coupled to a cathode of said second diode, a second electrode of said principal electrically conducting channel connected to ground via said second current source, and a control electrode coupled to receive said third reference voltage; and
a resistor interposed between the second electrodes of said second and third transistors.

13. The high frequency amplifier according to claim 10, wherein said first converter means comprises:
means for providing first, second and third current sources;
a first transistor having a first electrode of a principal electrically conducting channel coupled to said supply voltage, a second electrode of said principal electrically conducting channel connected to ground via said first current source, and a control electrode coupled to receive the second voltage;
a second transistor having a first electrode of a principal electrically conducting channel coupled to said supply voltage, a second electrode of said principal electrically conducting channel connected to ground via said second current source, and a control electrode coupled to receive the second voltage;
a third transistor having a first electrode of a principal electrically conducting channel coupled to said supply voltage, a second electrode of said principal electrically conducting channel connected to ground via said third current source, and a control electrode connected to the second electrode of said first transistor; and a fourth transistor having a first electrode of a principal electrically conducting channel coupled to said second converter means, a second electrode of said principal electrically conducting channel connected to ground via said third current source, and a control electrode connected to the second electrode of said second transistor.

14. The high frequency amplifier according to claim 10, wherein said second converter means comprises:

means for providing first and second current sources;

a first transistor having a first electrode of a principal electrically conducting channel coupled to said supply voltage, a second electrode of said principal electrically conducting channel connected to ground via said first current source, and a control electrode coupled to receive the first voltage;

a second transistor having a first electrode of a principal electrically conducting channel coupled to said supply voltage, a second electrode of said principal electrically conducting channel connected to ground via said second current source, and a control electrode coupled to receive the first voltage;

a third transistor having a first electrode of a principal electrically conducting channel coupled to said supply voltage, a second electrode of said principal electrically conducting channel connected to said first converter means, and a control electrode connected to the second electrode of said first transistor; and a fourth transistor having a first electrode of a principal electrically conducting channel connected to said third converter means for providing said output voltage having said linear gain characteristic, a second electrode of said principal electrically conducting channel connected to said first converter means, and a control electrode connected to the second electrode of said second transistor.

15. The high frequency amplifier according to claim 10, wherein said third converter means is comprised of a resistor and an output terminal for providing said output voltage having said linear gain characteristic.

16. The high frequency amplifier according to claim 10, wherein all of said transistors are NPN transistors.

17. An apparatus for controlling a linear gain of a wide-band signal, comprising:

means for providing a supply voltage and an external bias voltage;

means for providing a plurality of reference voltages and a plurality of constant current sources;

an input terminal for receiving a wide-band signal having high frequency characteristics;

a first differential amplifier interposed between said supply voltage and ground, and coupled to receive the external bias voltage and first selected ones of said reference voltages, for converting the external bias voltage into a first voltage;

a second differential amplifier interposed between said supply voltage and ground, and coupled to receive the wide-band signal and second selected ones of said reference voltages, for converting a voltage of said wide-band signal into a second voltage;

first and second transistors, each having a collector connected to said supply voltage, an emitter connected to ground via a first selected one of said constant current sources and a base coupled to receive said first voltage;

third and fourth transistors, each having a collector connected to said supply voltage, an emitter connected to ground via a second selected one of said constant current sources and a base coupled to receive said second voltage;

a fifth transistor having a collector connected to said supply voltage, an emitter connected to ground via a third selected one of said constant current sources and a base connected to the emitter of said third transistor;

a sixth transistor having a collector, an emitter connected to ground via said third selected one of said constant current sources and a base connected to the emitter of said fourth transistor;

a seventh transistor having a collector connected to said supply voltage, an emitter connected to the collector of said sixth transistor and a base connected to the emitter of said first transistor; and an eighth transistor having a collector connected to said supply voltage via a resistor, an emitter connected to the collector of said sixth transistor and a base connected to the emitter of said second transistor, wherein the collector of said eighth transistor serves as an output terminal for providing an output wide-band signal having a controlled linear gain characteristic.

18. The apparatus according to claim 17, wherein all of the transistors are NPN transistors.

19. The apparatus according to claim 17, wherein said first differential amplifier comprises:

first and second diodes;

a first NPN transistor having a collector coupled to said supply voltage via said first diode, an emitter connected to ground via a fourth selected one of said constant current sources, and a base coupled to receive said external bias voltage and a first of said first selected ones of said reference voltages;

a second NPN transistor having a collector coupled to said supply voltage via said second diode, an emitter connected to ground via a fifth selected one of said constant current sources, and a base coupled to receive a second of said first selected ones of said reference voltages; and a resistor interposed between the emitters of said first and second NPN transistors.

20. The apparatus according to claim 17, wherein said second differential amplifier comprises:

first and second diodes having cathodes and anodes serially connected to form a common anode node;

a first NPN transistor having a collector coupled to said supply voltage, an emitter connected to said common anode node, and a base coupled to receive a first of said second selected ones of said reference voltages;

a second NPN transistor having a collector coupled to the cathode of said first diode, an emitter connected to ground via a fourth selected one of said current sources, and a base coupled to receive the voltage of said wide-band signal and a second of said second selected ones of said reference voltages;

a third NPN transistor having a collector coupled to the cathode of said second diode, an emitter connected to ground via a fifth selected one of said current sources, and a base coupled to receive a third of said second selected ones of said reference voltages; and a resistor interposed between the emitters of said second and third NPN transistors.

* * * * *

UNITED STATES PATENT AND TRADEMARK OFFICE
CERTIFICATE OF CORRECTION

PATENT NO. : 5,256,984

DATED : October 26, 1993

INVENTOR(S) : Ga H. LEE

It is certified that error appears in the above-identified patent and that said Letters Patent is hereby corrected as shown below:

Claim 9,     Column 9,     Line 34,     delete "said" after "said".

Signed and Sealed this

Tenth Day of June, 1997

Attest:

Attesting Officer

BRUCE LEHMAN

Commissioner of Patents and Trademarks